United States Patent
Choi et al.

(10) Patent No.: US 7,262,440 B2
(45) Date of Patent: Aug. 28, 2007

(54) LIGHT EMITTING DIODE PACKAGE AND FABRICATION METHOD THEREOF

(75) Inventors: Sang Hyun Choi, Seoul (KR); Woong Lin Hwang, Kyungki-do (KR); Seog Moon Choi, Seoul (KR); Ho Joon Park, Seoul (KR); Sung Jun Lee, Seoul (KR); Chang Hyun Lim, Seoul (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 11/320,968

(22) Filed: Dec. 30, 2005

(65) Prior Publication Data

US 2006/0214178 A1    Sep. 28, 2006

(30) Foreign Application Priority Data

Mar. 24, 2005    (KR)    .................... 10-2005-0024651

(51) Int. Cl.
*H01L 29/22* (2006.01)
*H01L 23/498* (2006.01)
*H01L 21/00* (2006.01)

(52) U.S. Cl. ................. 257/99; 257/276; 257/E23.051; 257/E23.052; 257/E23.053; 257/E23.054; 257/E23.012; 257/E23.031; 257/E23.01; 438/22; 313/498

(58) Field of Classification Search .................. 257/99, 257/276, 625, 675, 706, 707, 712–722, 796
See application file for complete search history.

(56) References Cited

U.S. PATENT DOCUMENTS

| 5,905,275 | A * | 5/1999 | Nunoue et al. ................. 257/95 |
| 6,593,159 | B1 * | 7/2003 | Hashimoto et al. ........... 438/22 |
| 6,744,072 | B2 * | 6/2004 | Romano et al. ............... 257/81 |
| 2004/0222433 | A1 * | 11/2004 | Mazzochette et al. ......... 257/99 |
| 2005/0130351 | A1 * | 6/2005 | Leedy ......................... 438/128 |

FOREIGN PATENT DOCUMENTS

JP    2003-218398    7/2003

* cited by examiner

*Primary Examiner*—Anh D. Mai
*Assistant Examiner*—Mohammad Ghazzawi
(74) *Attorney, Agent, or Firm*—McDermott Will & Emery LLP

(57) ABSTRACT

The present invention provides a light emitting diode (LED) package and the fabrication method thereof. The LED package includes a lower metal layer, and a first silicon layer, a first insulation layer, a second silicon layer, a second insulation layer, and a package electrode pattern formed in their order on the lower metal layer. The LED package also includes a spacer having a cavity, formed on the electrode pattern. The LED package further includes an LED mounted in the cavity by flip-chip bonding to the electrode patterns, and an optical element attached to the upper surface of the spacer.

9 Claims, 9 Drawing Sheets

LIGHT EMITTING DIODE PACKAGE AND FABRICATION METHOD THEREOF

CLAIM OF PRIORITY

This application claims the benefit of Korean Patent Application No. 2005-24651 filed on Mar. 24, 2005, in the Korean Intellectual Property Office, the disclosure of which is incorporated herein by reference.

BACKGROUND OF THE INVENTION

1. Field of the Invention

The present invention relates to a light emitting diode (LED) package, and more particularly, to an LED package which is superior in heat discharge quality, compact in size, and appropriate for mass production, and to a fabrication method thereof.

2. Description of the Related Art

Recently, an LED using a compound of semiconductor material such as GaAs, AlGaAs, GaN, and AlGaInP has been developed to realize diverse colors of light source. The factors contributing to the characteristics of LED products include color, luminance, and light-conversion efficiency. The characteristics of an LED product are influenced by the primary factors including compound and structure of semiconductor material used in the LED, and also greatly by the secondary factors including the package structure for mounting the LED. As LEDs have been extensively applied to diverse fields such as indoor/outdoor illumination, automobile headlights, backlight units of LCD display devices, there have been an increasing number of characteristics desired in an LED package.

Especially, in order to be used for illumination, the LED generates a high output of light and requires input of high-voltage electricity. Therefore, the operation of the LED generates much heat. If the heat generated in the LED is not effectively discharged, the temperature of the LED increases, deteriorating the LED characteristics, and in turn, shortening the life of the LED. Therefore, there have been efforts to effectively discharge the heat generated from the LED. In order to improve the heat discharge quality of the LED package, Japanese Laid-Open Patent Application No. 2003-218398 discloses techniques of using a separated metal substrate with a narrow slit for an LED package substrate.

In addition, with the current trend of miniaturization and light weight of electronic components, there has been an increasing demand for a very thin, compact size LED package. For example, the LED package used in the backlight unit needs to be manufactured in compact size in order to miniaturize the backlight unit. However, the conventional LED packages have not satisfied such needs described above, and also the manufacturing process is complicated.

FIG. 1 is a sectional view illustrating an overall structure of a conventional LED package 10. This LED package 10 uses air as the medium of light. Referring to FIG. 1, the LED package 10 includes a metal substrate 2 with a narrow slit 6, a spacer 4 made of insulation substrate, and a cover plate 9 made of transparent glass. The slit is filled with insulator 3 such as epoxy resin, so that the metal substrate 4 forms two electrodes 2a and 2b that are separated from each other. The metal substrate 2, the spacer 4, and the cover plate 9 are adhered to each other by adhesive sheets 5 and 8 interpositioned between them. In the center of the spacer 4, a cavity or a through hole 4b is formed, and an LED chip 7 is received in the through hole 4b. The surface of the through hole 4b is coated with a metal film 11. This metal film 11 functions as a reflective surface on which the LED light emitted to the side is reflected upward. The LED 7 is flip-chip bonded to the two electrodes 2a and 2b of the metal substrate 2 via bumps 7a and 7b. The gap between the LED 7 and the metal substrate 2 may be filled with underfill resin.

The LED package 10 uses a metal substrate 2 to enhance the discharge quality of the heat generated from the LED 7. However, in order to manufacture the conventional LED package with the above construction, the metal substrate 2 needs to be finely processed to divide the metal substrate 2 into parts by a narrow slit 6. Therefore, the fabrication process of the LED package 10 is not easy, hindering obtainment of a sufficiently thin, compact size package. Furthermore, it is difficult to flip-chip bond the LED chip 7 precisely on the two electrodes 2a and 2b such that the LED chip 7 is positioned between the two bumps 7a and 7b.

SUMMARY OF THE INVENTION

The present invention has been made to solve the foregoing problems of the prior art and it is therefore an object of the present invention to provide an LED package which is thinner with compact size, effectively discharging the heat generated from an LED.

It is another object of the invention to provide a fabrication method of an LED package, which is capable of manufacturing a compact size LED package which is superior in heat discharge quality, and appropriate for the mass-production of a plurality of LED packages.

In order to realize the above described object, the LED package according to the present invention includes: a lower metal layer; a first silicon layer, a first insulation layer, a second silicon layer, a second insulation layer and a package electrode pattern formed in their order on the lower metal layer; a spacer having a cavity, formed on the package electrode pattern; an LED mounted in the cavity, flip-chip bonded to the package electrode pattern; and an optical element adhered to the upper surface of the spacer.

According to the present invention, the lower metal layer may include a metal film formed on the lower surface of the first silicon layer, and a metal core layer formed on the lower surface of the metal film. In this case, the metal core layer can be formed via electroplating with metal such as copper. According to an embodiment of the present invention, the metal core layer is formed only in an area corresponding to the mounting area of the LED. According to a preferred embodiment of the present invention, the lower metal layer is in contact with the first insulation layer in an area corresponding to the mounting area of the LED.

According to an embodiment of the present invention, the spacer may be made of silicon. Alternatively, the spacer may be made of insulation resin. Preferably, a reflective metal film made of Ag or Al is formed on the wall surface of the cavity.

According to a preferred embodiment of the present invention, the first insulation layer and the second insulation layer are thermal oxide films made by thermally oxidizing silicon. The thermal oxide film can be formed in a very small thickness such as thousands of Å, and therefore does not hinder heat discharge characteristics.

According to another aspect for realizing the object, the present invention provides a fabrication method of a light emitting diode (LED) package including steps of: preparing a submount substrate formed of a first silicon layer, a first insulation layer, a second silicon layer, and a second insulation layer deposited in their order; selectively etching the first silicon layer to form a groove exposing the first insulation layer in an area corresponding to a mounting area of an LED; forming a lower metal layer on the exposed surface of the first insulation layer and a lower surface of the first silicon layer to fill up the groove; forming a package electrode pattern on the second insulation layer, and mounting the LED on the package electrode pattern by flip-chip bonding; providing a spacer having a cavity on the package electrode pattern to receive the LED in the cavity; and adhering an optical element to the upper surface of the spacer.

According to an embodiment of the present invention, the step of preparing a submount substrate includes preparing a Silicon On Insulator (SOI) substrate formed of a first silicon layer, a first insulation layer, and a second silicon layer deposited in their order, and forming a second insulation layer on the SOI substrate.

According to another embodiment of the present invention, the step of preparing a submount substrate includes adhering the two silicon substrates via silicon direct bonding with the first insulation layer interposed therebetween, and forming the second insulation layer on one of the two silicon substrates.

According to a preferred embodiment of the present invention, the step of forming a lower metal layer includes forming a metal film on the exposed surface of the first insulation layer and the lower surface of the first silicon layer, and forming a metal core layer electroplated on the lower surface of the metal film to fill up the groove. Moreover, according to an embodiment of the present invention, the fabrication method of an LED package may further include a step of abrading the metal core layer to remove the metal core layer portion formed outside the groove after the step of forming a metal core layer.

According to an embodiment of the present invention, the step of providing a spacer having a cavity on the package electrode pattern includes selectively etching a spacer silicon substrate to form the cavity in the spacer silicon substrate, and adhering the spacer silicon substrate having the cavity therein to the package electrode pattern.

According to another embodiment of the present invention, the step of providing a spacer having the cavity on the package electrode pattern includes forming the cavity in an insulation resin substrate, and adhering the insulation resin substrate having the cavity therein to the package electrode pattern.

According to a preferred embodiment of the present invention, the fabrication method of an LED package further includes a step of coating a reflective metal film on the wall surface of the cavity in the spacer.

The fabrication method of the present invention can easily be adapted to fabricate a plurality of LED packages at the same time using a single submount substrate. In this case, the LED package formed with a single submount substrate is diced into individual packages to obtain a plurality of LED packages.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
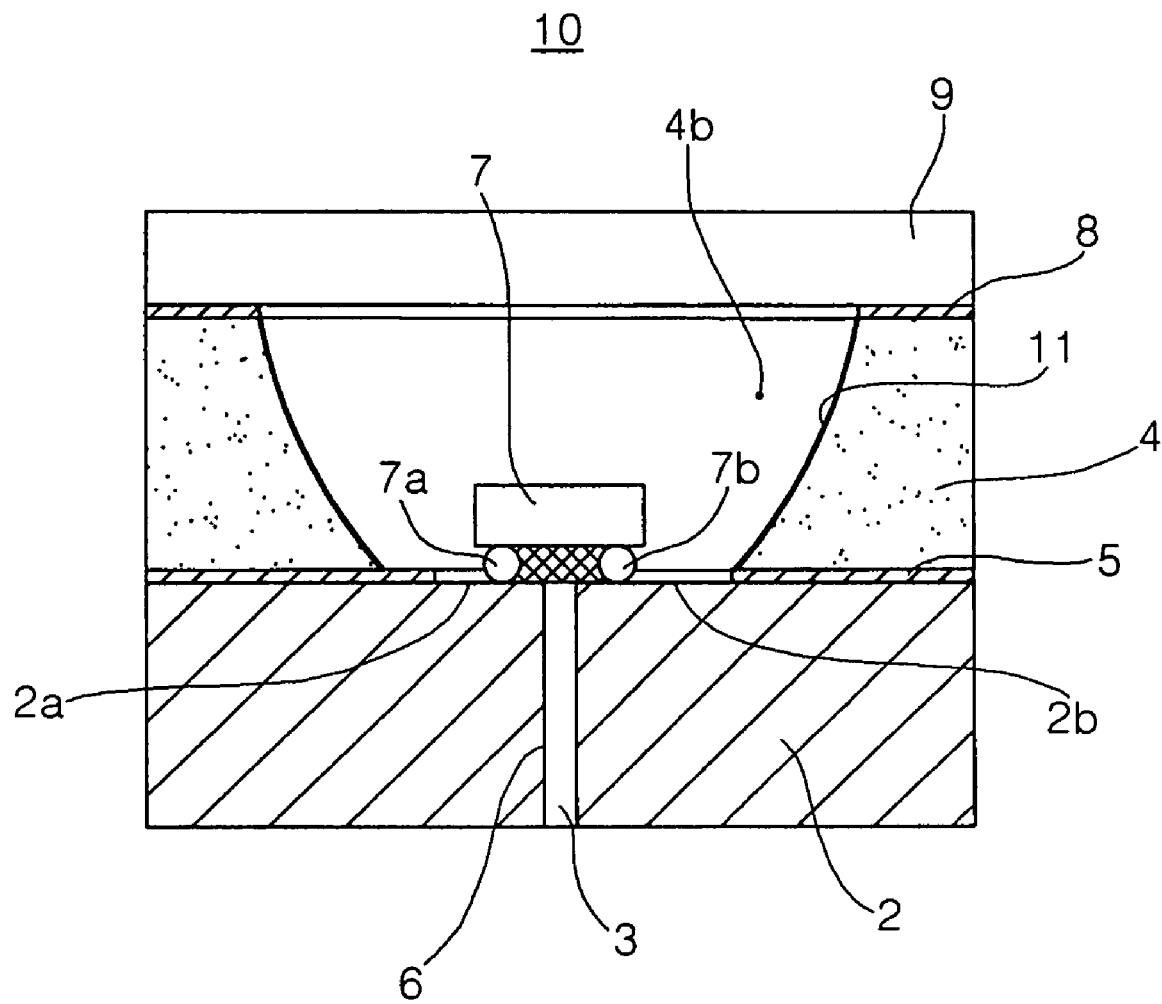
FIG. 1 is a sectional view illustrating a conventional LED package.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the dimensions and shapes are exaggerated for clarity, and the same reference numerals are used throughout the different drawings to designate the same or similar components.

Figure 2:
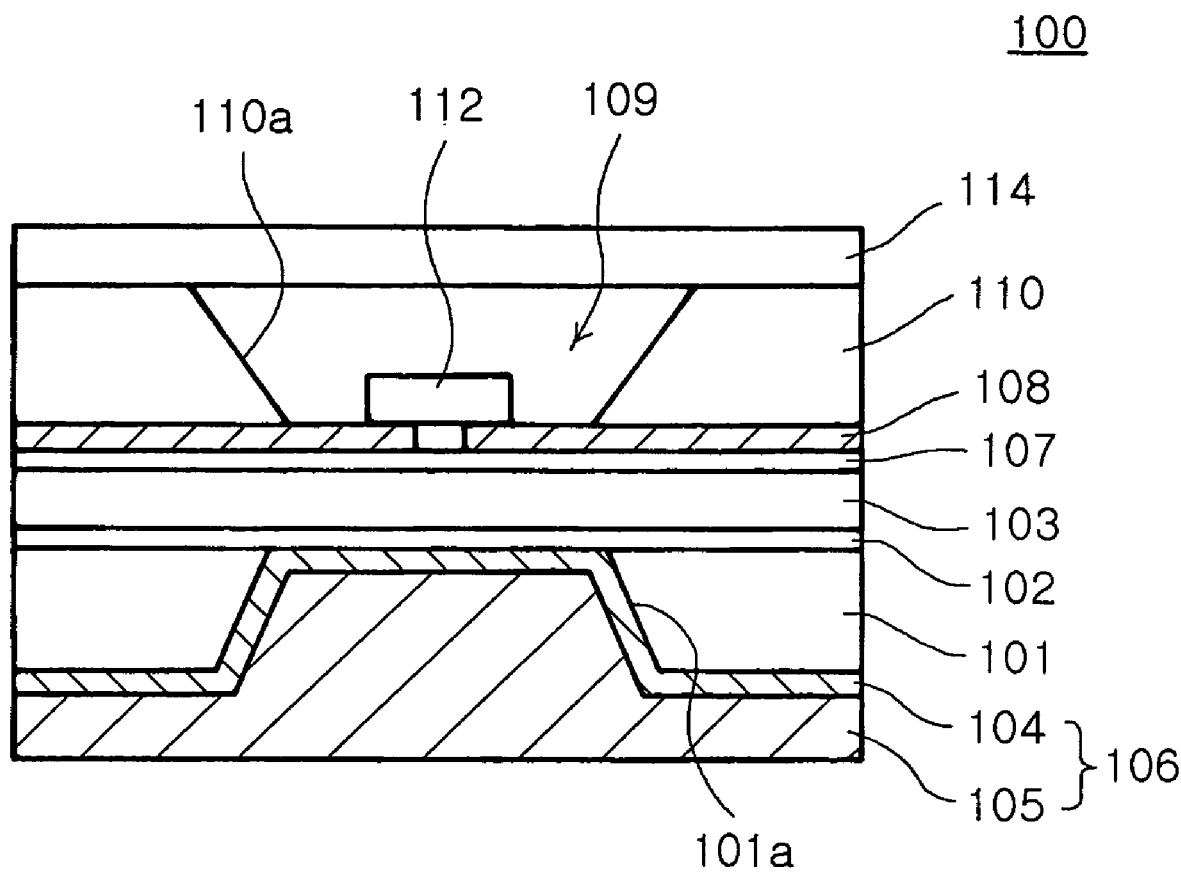
FIG. 2 is a sectional view illustrating an LED package according to an embodiment of the present invention.
Figure 4:
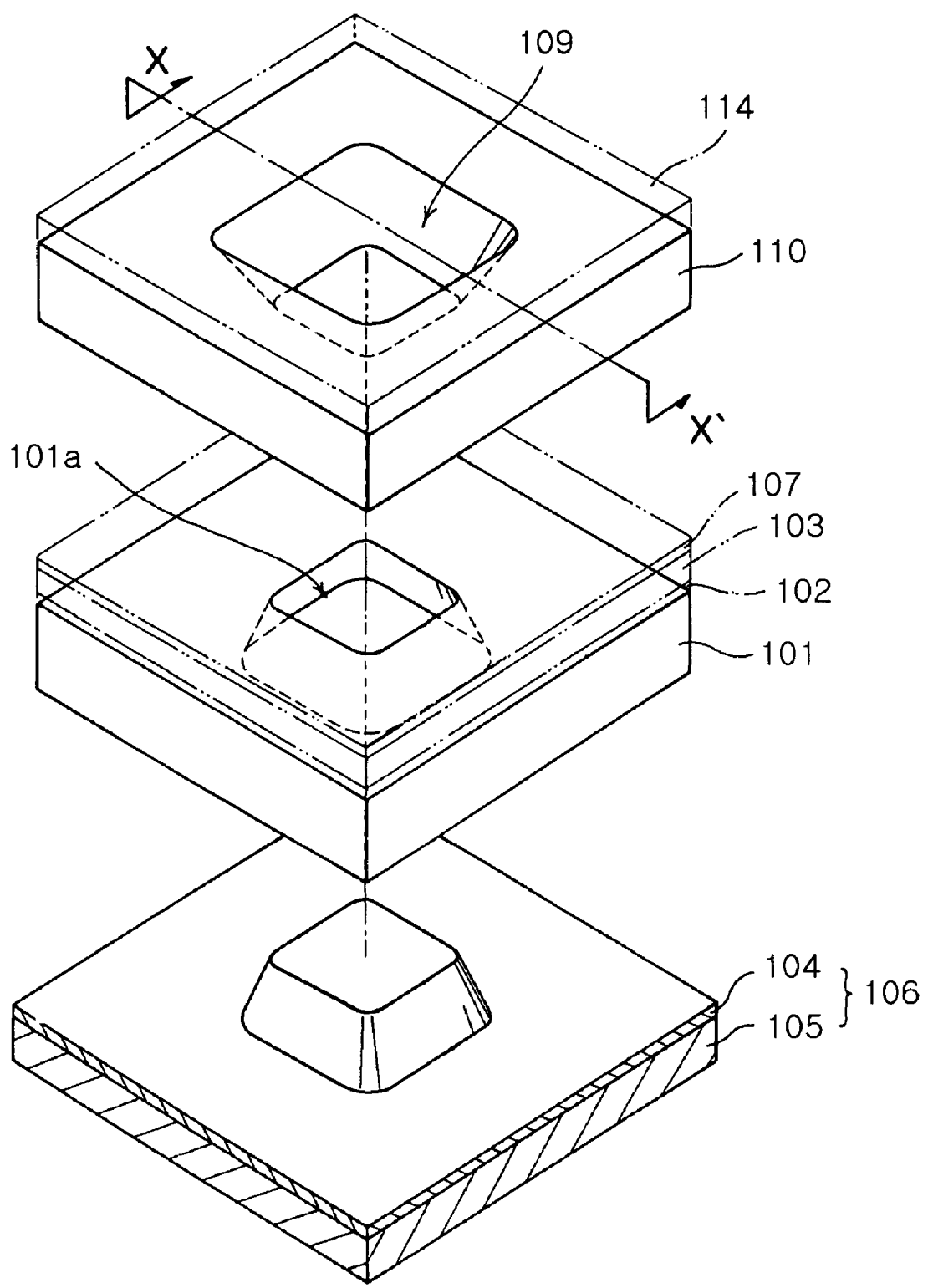
FIG. 4 is an overall perspective view of the LED package shown in FIG. 2.

FIG. 2 is a sectional view illustrating an LED package according to an embodiment of the present invention, and FIG. 4 is an overall exploded perspective view of the LED package shown in FIG. 2. FIG. 2 is a sectional view taken along the line XX' of FIG. 4. Referring to FIGS. 2 and 4, the LED package 100 includes a first silicon layer 101, a first insulation layer 102, a second silicon layer 103, and a second insulation layer 107 deposited in their order on a lower metal layer 106. The deposition structure of the layers 101-103 may be obtained from, for example, a Silicon on Insulator (SOI) substrate. In addition, the deposition structure, as will be explained hereunder, may also be obtained using silicon direct bonding. On the second insulation layer 107, package electrode pattern 108 is formed. This package electrode pattern 108 consists of a pair of electrodes separated from each other. The second insulation layer 107 has a function of preventing a short-circuiting of the pair of electrodes. The first insulation layer 102 and the second insulation layer 107 are thermal oxide films ($SiO_2$) obtained from thermally oxidizing the silicon layers 101 and 103.

On the electrode pattern 108, a spacer 110 having a cavity 109 is adhered by adhesion means such as an adhesive sheet (not shown). The spacer 110 may be made of silicon or insulation resin. In order to obtain sufficient light reflection effect from the wall surface 110a of the cavity 109, it is preferable to form a reflective metal film made of Ag or Al on the wall surface 109a of the cavity 109. However, in case of forming the spacer 110 with silicon, the wall surface 110a of the cavity 109 can be used as a reflective surface without an additional reflective metal film. Inside the cavity 109, an LED 112 is mounted by flip-chip bonding on the electrode pattern 108. The light emitted to sides from the LED is reflected upward by the reflective wall surface 110a. On the upper surface of the spacer 110, an optical element 114 is adhered by adhesion means such as an adhesive sheet (not shown). The optical element 114 plays a role of sealing the LED 112. For the optical element 114, an optical lens (e.g. a concave lens or a convex lens) or a transparent plate-shaped glass substrate may be used.

As shown in FIGS. 2 and 4, a groove 101a is formed on the first silicon layer 101 in the area corresponding to the mounting area of the LED 112, and the lower metal layer 106 fills up the groove 101a. Therefore, the lower metal layer 106 has a protuberant part in contact with the first insulation layer 102 in the area corresponding to the mounting area of the LED (refer to FIG. 4). This lower metal layer 106 consists of a metal film 104 and a metal core layer 105. For example, the lower metal layer 106 can be formed after forming a metal film 104 on the lower surface of the first silicon layer 101 by electroplating the metal film 104 with copper.

Figure 3:
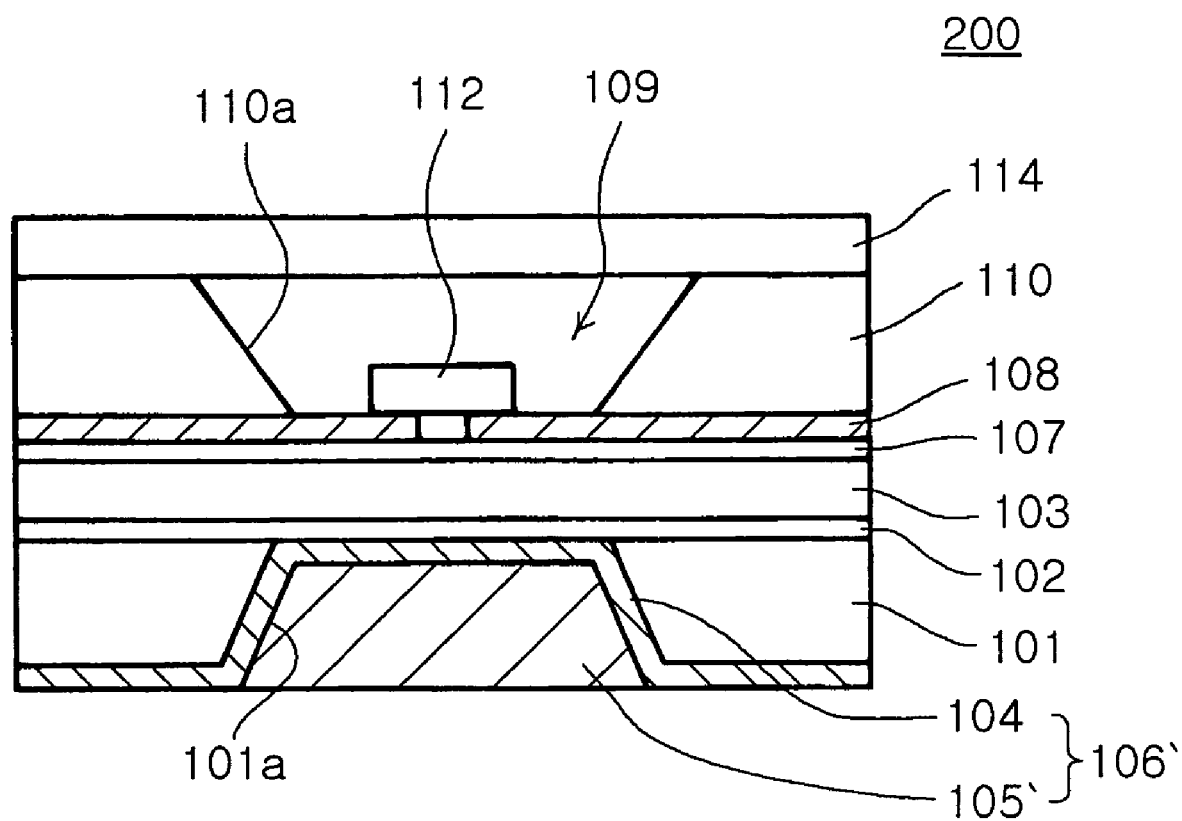
FIG. 3 is a sectional view illustrating an LED package according to another embodiment of the present invention.

FIG. 3 is a sectional view of the LED package 200 according to another embodiment of the present invention. The LED package 200 shown in FIG. 3 is identical with the LED package shown in FIGS. 2 and 4, except that the metal core layer 105' is formed only in an area corresponding to a mounting area of the LED 112. That is, as shown in FIG. 3, the metal core layer 105' in the lower metal layer 106' is formed only in the groove 101a formed in an area corresponding to a mounting area of the LED 112, but not in the area outside the groove 101a. Such structure can be obtained by abrading the lower part of the metal core layer 105 of the LED package 100 via processes like Chemical Mechanical Polishing (CMP), for example. Even if the metal core layer 105' is formed only in the groove, improved heat discharge effect can be obtained. This is because most of the heat generated in the package can be discharged through the metal core layer formed around the groove. The LED package 200 shown in FIG. 3 has an advantage in this regard since it has a small thickness.

As described above, the LED package 100 and 200 uses the silicon layers 101 and 103, the lower metal layer 106, and the insulation layers 102 and 107 for the submount mounted with the LED. The silicon layers 101 and 103 and the lower metal layer 106 can have even smaller thickness than the conventional metal substrate 2 (FIG. 1) with a narrow slit formed therein, and the insulation layers 102 and 107 can be formed in a very small thickness such as thousands of Å. Also, the second silicon layer 103 can be formed in a small thickness such as tens of µm. Therefore, the LED package 100 and 200 can have even smaller thickness compared with the conventional LED package (refer to FIG. 1), appropriate for miniaturization.

Since heat conductivity of silicon is as great as that of metal, the silicon layers 101 and 103 have an advantage in heat discharge. Particularly, as the lower metal layer 106 and 106' comes in contact with the first insulation layer 102 in an area corresponding to a mounting area of the LED 112, the heat discharge effect is even more enhanced. The insulation layers 102 and 107 included in the submount can be formed in a small thickness of about thousands of Å via thermal oxidization of silicon. Therefore, the blocking effect of heat discharge by the insulation layers 102 and 107 can be so small as to be negligible. Since the silicon layers 101 and 103 and the lower metal layer 106 and 106' having great heat conductivity are used with the insulation layers 102 and 107 formed of thin thermal oxide films for the submount, the heat generated from the LED 112 can be discharged effectively.

Now, with reference to FIGS. 5 to 10, a fabrication method of an LED package according to an embodiment of the present invention is explained.

Figure 5:
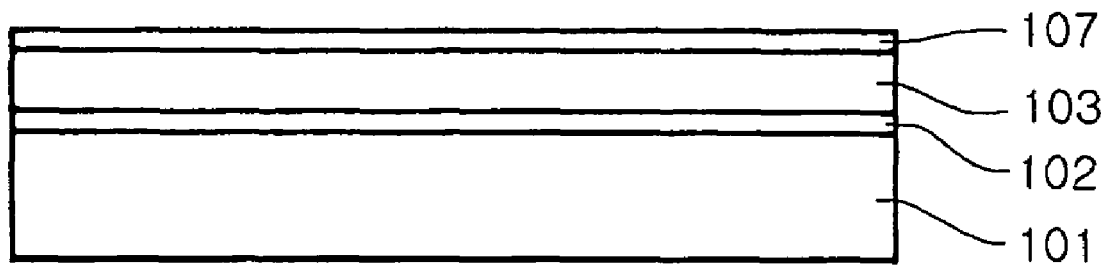
FIGS. 5 to 10 are sectional views illustrating a fabrication method of an LED package according to an embodiment of the present invention.

First, referring to FIG. 5, a submount substrate formed of a first silicon layer 101, a first insulation layer 102, a second silicon layer 103, and a second insulation layer 107 which are layered in their order, is prepared. This submount substrate can be obtained from, for example, a SOI substrate. That is, the SOI substrate having a layered structure of the first silicon layer 101, the first insulation layer 102, and the second silicon layer 103 is prepared. It is preferable that the first insulation layer 102 is a thermal oxide film. Then, the second silicon layer 103 of the SOI substrate is thermally oxidized to form the second insulation layer 107 on the second silicon layer. Thereby, the submount substrate as shown in FIG. 5 is obtained.

Alternatively, silicon direct bonding can be used to obtain the submount substrate, as shown in FIG. 5. That is, two silicon substrates are bonded via silicon direct bonding with the first insulation layer (thermal oxide film) interposed therebetween. Then, one of the silicon substrates is thermally oxidized to form the second insulation layer. Thereby, the submount as shown in FIG. 5 is obtained.

Figure 6:
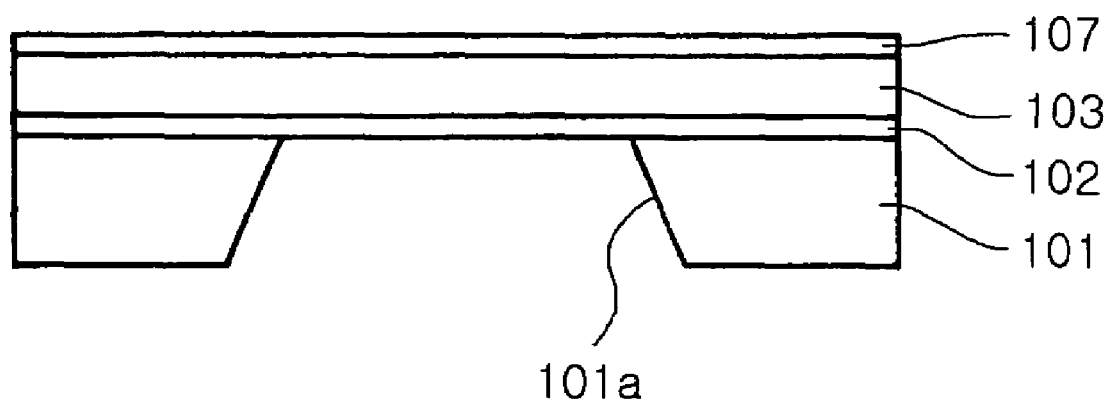

Next, as shown in FIG. 6, the first silicon layer 101 is selectively wet-etched to form a groove 101a in an area corresponding to a mounting area of an LED. Thereby, the first insulation layer 102 is exposed in an area corresponding to a mounting area of the LED. At this time, an etchant having high etching selectivity of silicon to thermal oxide film can be used to conveniently control the wet-etching process such that the first insulation layer 102 is not etched. The groove 101a is to be filled up with metal in a subsequent step.

Figure 7:
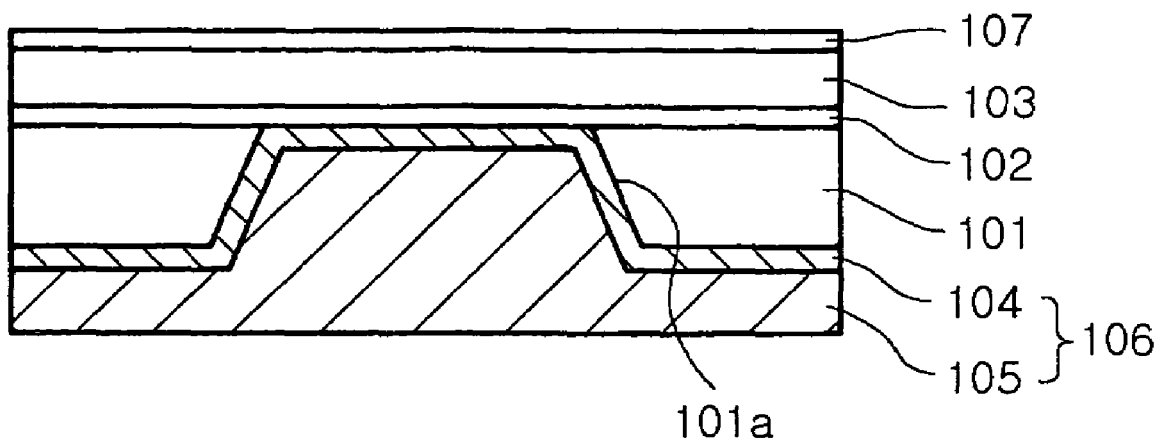

Next, as shown in FIG. 7, a metal film 104 is formed on the exposed surface of the first insulation layer 102 and the lower surface of the first silicon layer 101. This metal film 104 functions as a seed layer for the subsequent electroplating. Thereafter, the lower surface of the metal film 104 is electroplated with copper to form a metal core layer 105 which completely fills up the groove 101a. Thereby, a lower metal layer 106 is formed to come in contact with the first insulation layer 102 in an area corresponding to a mounting area of the LED. Alternatively, after electroplating is completed, the metal core layer 105 formed outside the groove 101a can be abraded and removed via processes such as CMP (In this case, the LED package 200 as shown in FIG. 3 can be obtained).

Figure 8:
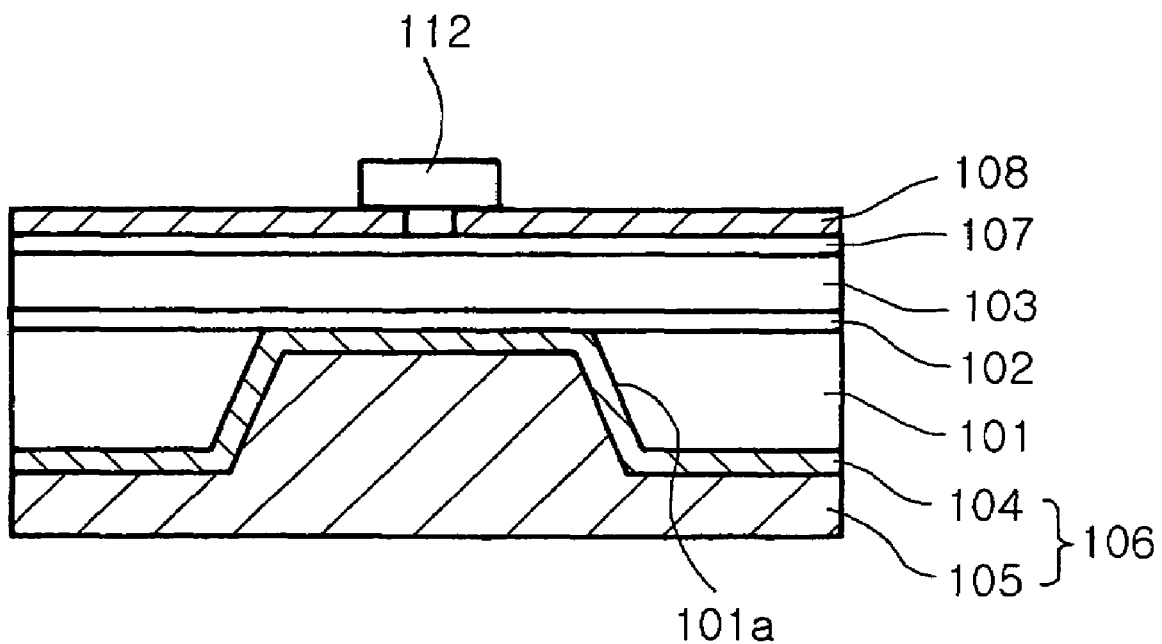

Next, as shown in FIG. 8, a package electrode pattern 108 consisting of two metal electrodes is formed on the second insulation layer 107. Then, the LED is flip-chip bonded on the electrode pattern 108 and mounted on the submount. At this time, the LED can be flip-chip bonded on the package electrode pattern 108 via a solder bump formed on each electrode.

Figure 9:
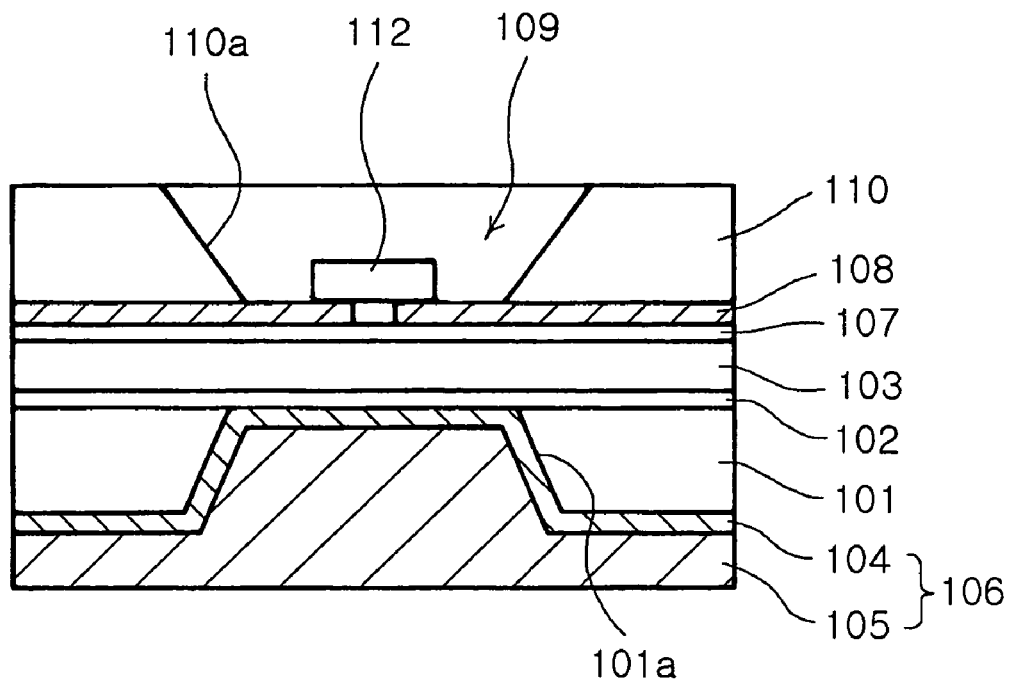

Then, as shown in FIG. 9, a spacer 110 having a cavity 109 formed therein is adhered on the top of the package electrode pattern 108, so that the LED 112 is placed in the cavity 109. It is preferable that the wall surface of the cavity 110a is coated with a reflective metal film made of Ag or Al.

The spacer may be made from a silicon substrate. That is, the silicon substrate is wet-etched to form the cavity 109, and then the silicon substrate is bonded to the package electrode pattern 108 to provide the spacer 110 on the package electrode pattern 108. In this case, the wall surface of the cavity formed by wet-etching can be used as a reflective surface, without coating an additional reflective metal film. But, in order to obtain even greater reflection effect, a reflective metal film of Ag or Al may be formed on the wall surface 110a of the cavity.

Alternatively, the spacer 110 can be made from an insulation resin substrate. That is, the cavity 109 is formed on the insulation resin substrate, and then the insulation resin substrate is bonded to the package electrode pattern 108, so that the spacer is formed on the package electrode pattern 108. Because insulation resin is lower in reflectivity than metal or silicon, a reflective metal film of Ag or Al is coated on the wall surface 109a of the cavity of the spacer.

Figure 10:
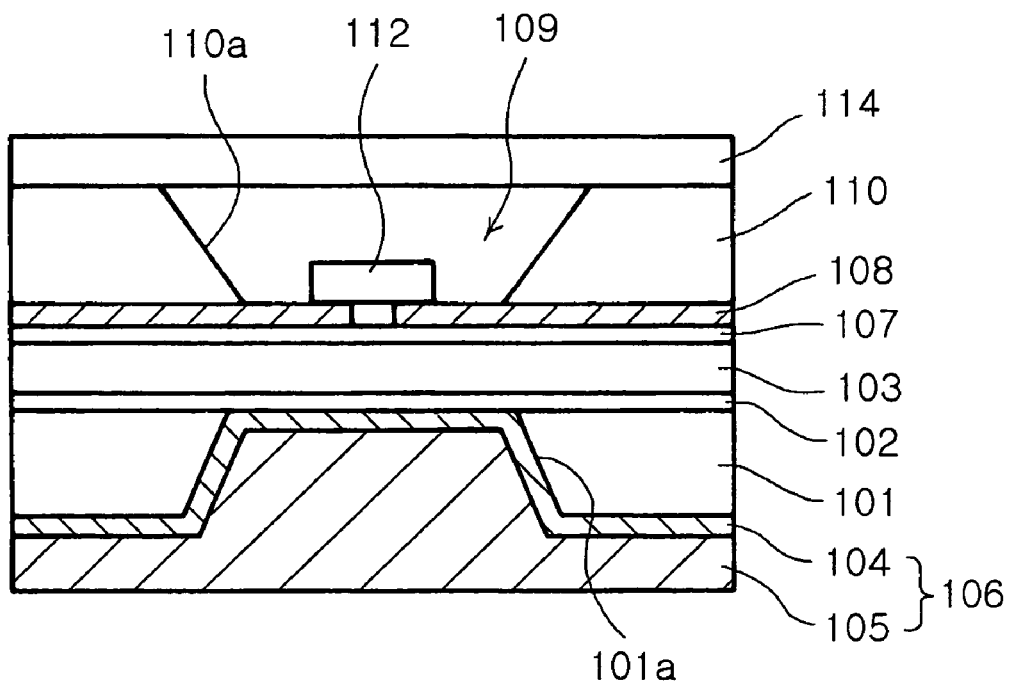

Then, as shown in FIG. 10, an optical element 114 is adhered to the upper surface of the spacer 110 using appropriate adhesion means such as an adhesive sheet (not shown). Thereby, the LED package according to this embodiment is obtained. The optical element 114 functions as a cover plate sealing the LED 112, and can be made of an optical lens such as a concave lens or a convex lens or simple plate-shaped glass.

Unlike the conventional method, a submount substrate with a narrow slit 6(FIG. 1) is not needed in the fabrication method according to the preferred embodiment of the present invention. Moreover, the fabrication method according to the preferred embodiment of the present invention can use general semiconductor processes such as wet-etching of silicon and thermal oxidization. Therefore, the preferred embodiment of the present invention allows easier fabrication method of the LED package compared to the conventional method.

The fabrication method of the LED package according to the present invention can easily be adapted to simultaneously fabricate a plurality of LED packages using a wafer-level substrate. That is, the fabrication method of the LED package described above can be directly applied to a single wafer-level submount substrate and an LED package array is formed on the single substrate. Then the LED package array is diced into individual LED packages, obtaining a plurality of LED packages at the same time. An example of fabricating a plurality of LED packages is illustrated in FIGS. 11 and 12.

Figure 11:
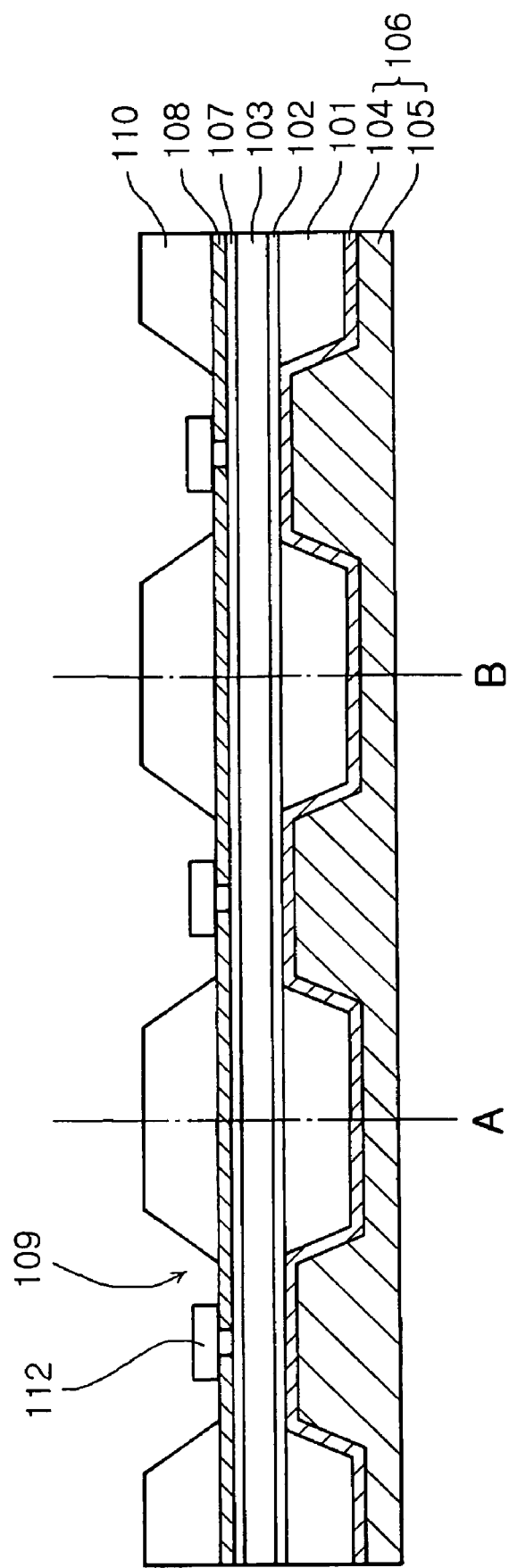
FIGS. 11 and 12 are views illustrating a method of simultaneously fabricating a plurality of LED packages according to an embodiment of the present invention.

Referring to FIG. 11, a wafer-level submount substrate is prepared. This submount substrate consists of a silicon layer 101, a first insulation layer 102, a second silicon layer 103, and a second insulation layer 107. Then, the first silicon layer 101 is selectively wet-etched to form a plurality of grooves which expose the first insulation layer 102, and a lower metal layer 106 is formed to fill up the grooves. This lower metal layer 106 consists of a metal film 104 and an electroplated metal core layer 105. Then, a plurality of package electrode patterns 108 are formed on the second insulation layer 107, and a plurality of LEDs 112 are mounted on the plurality of package electrode patterns by flip-chip bonding. Then, a spacer having a plurality of cavities 109 is adhered to the electrode patterns 108, so that each LED 112 is mounted inside each cavity 109.

Figure 12:
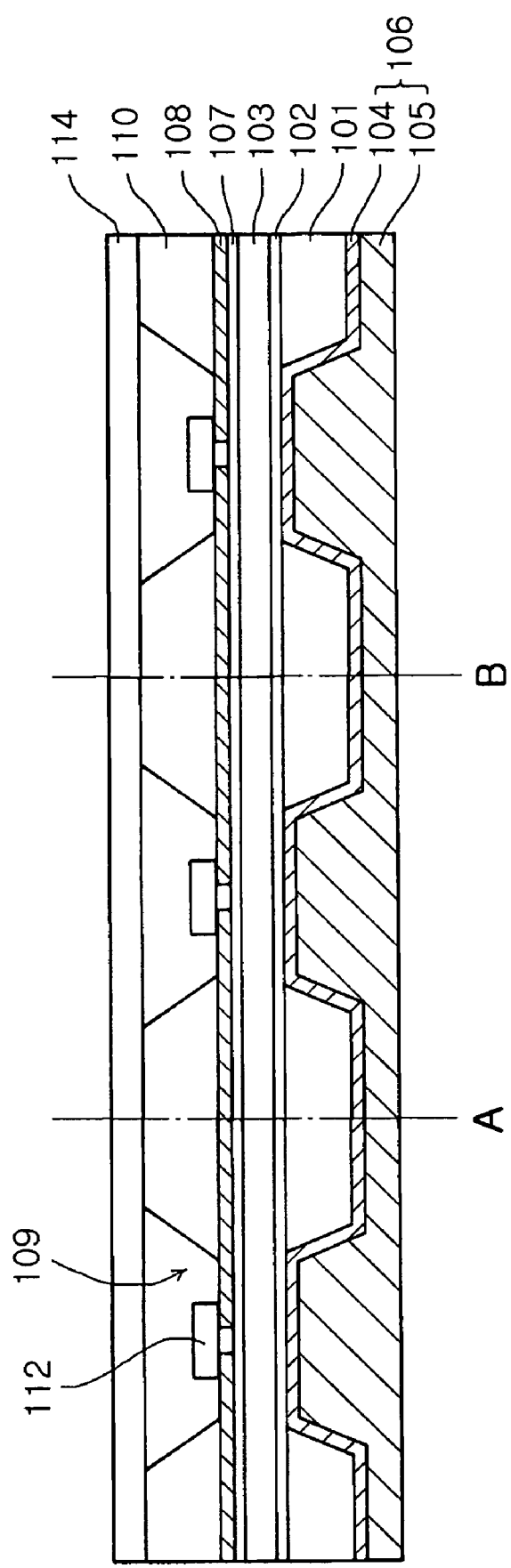

Then, as shown in FIG. 12, an optical element 114 is adhered on the top of the spacer 110. Thereby, an LED package array mounted with a plurality of LEDs 110 is fabricated. Then, the LED package array is diced along the lines A and B to obtain a plurality of individual LED packages. Therefore, the fabrication method of the LED package according to the present invention can easily be adapted to fabricate the LED package array and also appropriate for mass production of the LED packages.

As set forth above, the present invention uses the silicon layers and the lower metal layer for the submount substrate, effectively discharging the heat generated from the LED, thereby realizing a compact size LED package having smaller thickness. In addition, the present invention allows easier fabrication process of the LED package and is appropriate for mass production of high quality LED packages at lower costs.

While the present invention has been shown and described in connection with the preferred embodiments, it will be apparent to those skilled in the art that modifications and variations can be made without departing from the spirit and scope of the invention as defined by the appended claims.

What is claimed is:

1. A light emitting diode package comprising:
   a lower metal layer;
   a first silicon layer, a first insulation layer, a second silicon layer, a second insulation layer and a package electrode pattern formed in their order on the lower metal layer;
   a spacer having a cavity, formed on the package electrode pattern;
   an LED mounted in the cavity, flip-chip bonded to the package electrode pattern; and
   an optical element adhered to the upper surface of the spacer.

2. The light emitting diode package according to claim 1, wherein the lower metal layer comprises a metal film formed on the lower surface of the first silicon layer, and a metal core layer electroplated on the lower surface of the metal film.

3. The light emitting diode package according to claim 2, wherein the metal core layer is formed only in an area corresponding to the mounting area of the LED.

4. The light emitting diode package according to claim 1, wherein the lower metal layer is in contact with the first insulation layer in an area corresponding to the mounting area of the LED.

5. The light emitting diode package according to claim 1, wherein the spacer is made of silicon.

6. The light emitting diode package according to claim 1, wherein the spacer is made of insulation resin.

7. The light emitting diode package according to claim 1, wherein a reflective metal film is formed on the wall surface of the cavity.

8. The light emitting diode package according to claim 7, wherein the reflective metal film is made of Ag or Al.

9. The light emitting diode package according to claim 1, wherein the first insulation layer and the second insulation layer comprise thermal oxide films.

* * * * *